United States Patent
Hur et al.

(10) Patent No.: US 6,833,287 B1
(45) Date of Patent: Dec. 21, 2004

(54) SYSTEM FOR SEMICONDUCTOR PACKAGE WITH STACKED DIES

(75) Inventors: Hyeong Ryeol Hur, Singapore (SG); Henry D. Bathan, Singapore (SG); Zigmund R. Camacho, Singapore (SG)

(73) Assignee: ST Assembly Test Services Inc., Singapore (SG)

(*) Notice: Subject to any disclaimer, the term of this patent is extended or adjusted under 35 U.S.C. 154(b) by 0 days.

(21) Appl. No.: 10/463,007

(22) Filed: Jun. 16, 2003

(51) Int. Cl.[7] .......................... H01L 21/44; H01L 23/48
(52) U.S. Cl. ...................... 438/107; 438/108; 438/118; 257/686; 257/723; 257/777
(58) Field of Search .................. 438/107, 108, 438/118, 119; 257/685, 686, 723, 724, 725, 777, 778

(56) References Cited

U.S. PATENT DOCUMENTS

| | | | |
|---|---|---|---|
| 5,864,177 A | 1/1999 | Sundstrom | |
| 6,258,626 B1 * | 7/2001 | Wang et al. | 438/109 |
| 6,337,225 B1 | 1/2002 | Foong et al. | |
| 6,352,879 B1 * | 3/2002 | Fukui et al. | 438/109 |
| 6,387,728 B1 | 5/2002 | Pai et al. | |
| 6,400,007 B1 * | 6/2002 | Wu et al. | 257/777 |
| 6,407,456 B1 | 6/2002 | Ball | |
| 6,472,758 B1 * | 10/2002 | Glenn et al. | 257/777 |
| 6,569,709 B2 * | 5/2003 | Derderian | 438/109 |
| 6,706,557 B2 * | 3/2004 | Koopmans | 438/109 |
| 2002/0123172 A1 | 9/2002 | Milla et al. | |
| 2002/0182774 A1 | 12/2002 | Heckman | |

* cited by examiner

Primary Examiner—Kevin M. Picardat
(74) Attorney, Agent, or Firm—Mikio Ishimaru

(57) ABSTRACT

A semiconductor package with stacked dies and method of assembly is provided. A first die is attached to a substrate. A protective layer is placed on the first die over a central area thereof. The first die is electrically connected to the substrate. An intermediate adhesive layer is applied over the protective layer. A second die is attached to the intermediate adhesive layer and electrically connected to the substrate.

20 Claims, 6 Drawing Sheets

SYSTEM FOR SEMICONDUCTOR PACKAGE WITH STACKED DIES

BACKGROUND

1. Technical Field

The invention relates to the fabrication of integrated circuit devices, and more particularly, to a method and package for a multi-die module which employs stacked dies.

2. Background Art

Semiconductors, or computer chips, have made their way into virtually every electrical product manufactured today. Chips are used not only in very sophisticated industrial and commercial electronic equipment, but also in many household and consumer items such as televisions, clothes washers and dryers, radios and telephones. As many of these types of products become smaller but more functional, there is a need to include more chips in these smaller products. The reduction in size of cellular telephones is one example of how more and more capabilities find their way into smaller and smaller electronic products.

The popularity of smaller and more complicated electronic products has placed increased demands on the packaging for chips used in such devices. These increased demands have led to new chip packaging concepts and approaches. Unpackaged chips are referred to as die or dies, and current packaging methods include placing more than one die in a single package. One such approach is to stack one die on top of another and then enclose the stack of dies in one package. The final package for the multiple-stacked semiconductor dies is much smaller than would result if the dies were each packaged separately. In addition to providing a smaller size, these packages offer a number of advantages that relate to the manufacturing of the package such as ease of handling and assembling.

An example of a die stacking technique incorporates a pair of stacked dies encapsulated in a molded plastic package that has connectors or leads extending out from the package which function as input/output terminals of the die inside the package. The package includes a substrate and a first die mounted on the top surface of the substrate. A second die is then stacked on top of the first die.

The substrate may be comprised of a flexible resin tape, a rigid fiber-glass/copper sheet laminate, a co-fired ceramic coupon, or a flexible metal lead frame, a ball grid array substrate or other well-known types of substrates in the semiconductor industry, depending on the particular type of semiconductor package being used.

The first die is conventionally mounted to the top surface of the substrate with, for example, a layer of an adhesive or an adhesive film, and then electrically connected to the substrate by a plurality of fine, conductive wires, typically gold (Au) or aluminum (Al), that electrically connects the die to the substrate. The wires are attached to the die at the bonding pads of the die which are located around the periphery of the die.

The second die is mounted on the top surface of the first die with an adhesive layer that is positioned within the central area of the top surface of the first die. The adhesive layer may contact or cover both the bonding pads of the first die and the conductive wires bonded to the first die. The adhesive layer positions the second die sufficiently far above the first die to prevent the dies from contacting each other or any wires connected to the dies. The second die is then wire bonded to the substrate in the same fashion as the first die. One or more additional dies can then be stacked on top of the second die using the same technique.

In a stacked die arrangement, the dies are wire bonded sequentially, typically with automated wire bonding equipment employing well-known thermal-compression or ultrasonic wire bonding techniques. During the wire bonding process, the head of a wire bonding apparatus applies a downward pressure on a conductive wire held in contact with a wire bonding pad on the die to weld or bond the wire to the bonding pad on the die.

After the dies are wire bonded to the substrate, the dies, substrate, and conductive wires are covered with plastic, or other suitable material, which encapsulates the stacked dies and protects them from moisture and other environmental elements.

Despite efforts to overcome problems resulting in lower yields of semiconductor packages with stacked dies problems still exist. In particular, dies within the stack fail prematurely.

Solutions to these problems have been long sought, but prior developments have not taught or suggested satisfactory solutions and, thus, solutions to these problems have long eluded those skilled in the art.

DISCLOSURE OF THE INVENTION

The present invention provides a semiconductor package with stacked dies and a method of manufacture therefor. A first die is attached to a substrate. A protective layer is placed on the first die over a central area thereof. The first die is electrically connected to the substrate. An intermediate adhesive layer is applied over the protective layer. A second die is attached to the intermediate adhesive layer and electrically connected to the substrate. This package and method increases the yield of semiconductor packages with stacked dies as well as device reliability.

Other advantages in addition to or in place of those mentioned above will become apparent to those skilled in the art from a reading of the following detailed description when taken with reference to the accompanying drawings.

DETAILED DESCRIPTION OF THE INVENTION

Figure 1:
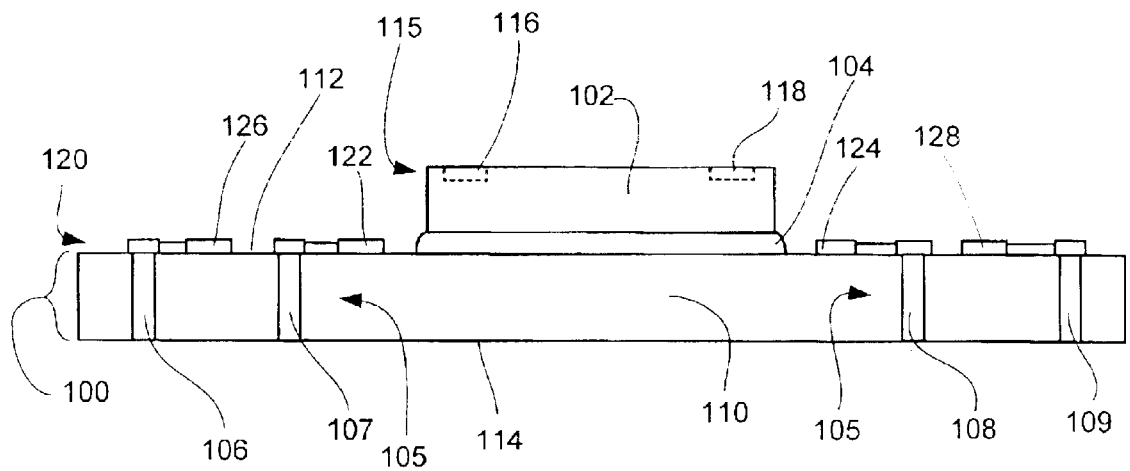
FIG. 1 is a side view of a semiconductor substrate with a first adhesive layer thereon and a first die attached in accordance with the present invention.

As dies have been stacked in single packages to meet the demands of modern electronic products, a variety of different semiconductor failures have arisen. Although solutions to the problems associated with stacking dies in a single package have been suggested, problems still exist. For example, it was believed that lack of support for the bonding pads of a second die caused cracks in the second die during the wire bonding of the second die. Wire bonding equipment induces a significant force to the bonding pad on the die during wire bonding. One proposed solution to this problem is to provide an adhesive layer between the dies that substantially completely fills the space between the dies to provide support for the second die during wire bonding thereby reducing the incidence of die cracking. Although this tends to reduce die cracking during wire bonding, semiconductor failures continue resulting in undesirable yields.

Additionally, the adhesive layer used to connect two dies in a stacked die semiconductor package adds a material between the dies which has different thermal characteristics than the thermal characteristics of the dies. Accordingly, the adhesive layer tends to separate from the dies during operation of the semiconductor. The difference in thermal coefficient of expansion between the dies and the adhesive layer between the dies induce thermal and mechanical stresses in the various layers in the die stack. This causes the passivation layer on the lower die to separate from the lower die damaging the protection provided by the passivation layer that is typically applied to the die during manufacture of the die.

It was also discovered that, since the dies can be of various thicknesses and the thickness of the adhesive can vary and cause the height of the dies to vary with respect to the adhesive application equipment, portions of the adhesive application equipment can indent or scratch the passivation layer on the die while the adhesive layer is applied. This can cause electrical shorts, open circuits, and other damage to the die during operation of the semiconductor.

After trying a number of different solutions to the indentation and scratching problem, it was finally discovered that application of an organic protective layer with a thermal coefficient of expansion within a certain range on the area of the die susceptible to indenting and scratching provided a solution not only to the indentation or scratching problem, but also could be used to reduce the effects of the difference in the thermal coefficients of expansion between the adhesive layers and the dies.

In the drawings common elements are labeled with the same reference numerals.

Referring now to FIG. 1, therein is shown a side view of a substrate 100 and a first die 102 attached thereto using a first adhesive layer 104. The substrate 100 includes a plurality of conductive vias 105 which are individually referred to as a via 106, a via 107, a via 108, and a via 109, each passing through the substrate 100.

While the substrate 100 shown is a rigid sheet laminate, it will be understood by those skilled in the art that a wide variety of substrates could be used without departing from the spirit and the scope of the present invention as described and claimed herein. For example, the substrate 100 could be a flexible resin tape or a flexible metal lead frame, or other suitable material. The substrate 100 comprises an insulating material layer 110 having an upper surface 112 and a lower surface 114. An upper surface 112 of the substrate 100 includes a plurality of contacts 120 represented by a contact 122, a contact 124, a contact 126, and a contact 128. Each of the plurality of contacts 120 is electrically connected to one of the plurality of conductive vias 105. Thus, the contact 122 is connected to the via 107, the contact 124 is connected to the via 108, the contact 126 is connected to the via 106, and the contact 128 is connected to the via 109.

The term "horizontal" as used in herein is defined as a plane parallel to the conventional plane or surface of a die, regardless of its orientation. The term "vertical" refers to a direction perpendicular to the horizontal as just defined. Terms, such as "on", "upper", "lower", "under", "top", "bottom", "above", "below", and "over", are defined with respect to the horizontal plane.

The first die 102 has a first plurality of bonding pads 115, represented by a bonding pad 116 and a bonding pad 118, located around the periphery of the top surface of the first die 102. The bottom surface of the first die 102 is attached to the upper surface 112 of the substrate 100 using the first adhesive layer 104. The first adhesive layer 104 may be an adhesive tape or, as shown in FIG. 1, a liquid adhesive which can be applied with automated die attach equipment generally known in the industry. The first adhesive layer 104 can comprise a wide variety of known die attach adhesives, although it is desirable that the first adhesive layer 104 have a relatively high viscosity so it will remain in place on the upper surface 112 of the substrate 100 and not spill off the edge of the upper surface 112.

Figure 2A:
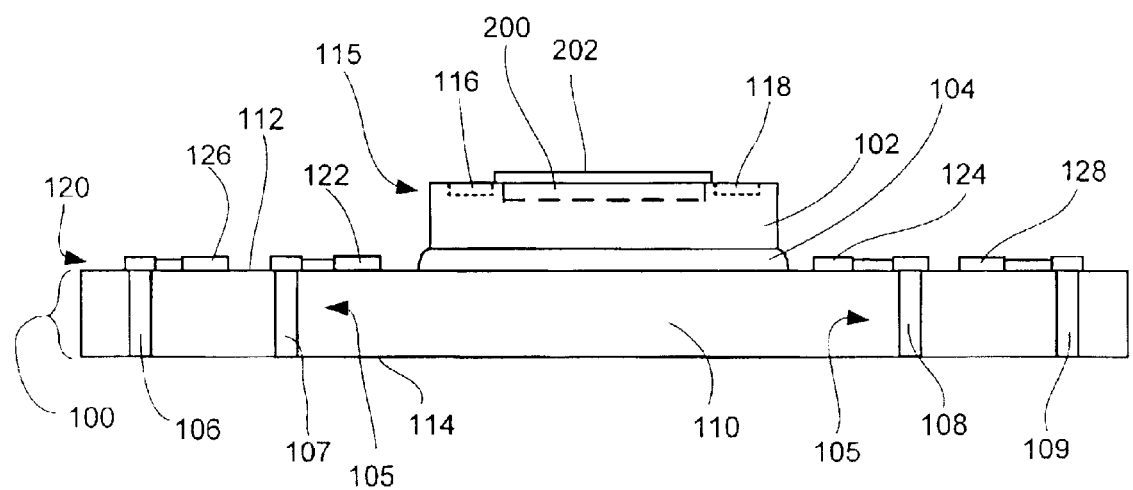
FIG. 2A is the structure of FIG. 1 with a protective layer over a central area of the first die.

Referring now to FIG. 2A, therein is shown the structure of FIG. 1 with the addition of a protective layer 202 covering a central area 200 of the first die 102. The central area 200 as shown is the inner portion of the upper surface of the first die 102 with the first plurality of bonding pads lying outside the central area 200. Therefore, the central area 200 is surrounded by the first plurality of bonding pads 115. The protective layer 202 covers a substantial portion of the central area 200.

The material selected for the protective layer 202 preferably has a suitable coefficient of thermal expansion. As previously discussed above, a difference in the thermal coefficient of expansion between the dies and the adhesive layer attaching the dies can tend to induce undesirable thermal and physical stresses in the dies during operation of the semiconductor resulting in semiconductors being rejected for quality reasons or subject to premature failure in the field.

It has been discovered that the protective layer 202 preferably has a thermal coefficient of expansion of about 7 to about 70 ppm/° C., at less than about 40° C., and about 20 to about 200 ppm/° C. at greater than about 40° C. The protective layer 202 can range in thickness from about 25 $\mu$m to about 200 $\mu$m. The protective layer 202 also preferably has an elastic modulus of about 800 MPa at room temperature. The protective layer 202 preferably is an organic material selected from the group of materials consisting of a polyimide, a screen-printable polymer, an elastomeric film, and combinations thereof The protective layer 202 can be applied using a variety of methods known in the semiconductor industry. Applying the protective layer 202 can be achieved using a method selected from the group consisting of cut-pick-and-place of a film, screen printing of a screen printable polymer, film transfer of a film, wafer lamination, and combinations thereof. Preferably, the protective layer 202 is applied using a cut-pick-and-place of a film, or wafer lamination method.

Figure 2B:
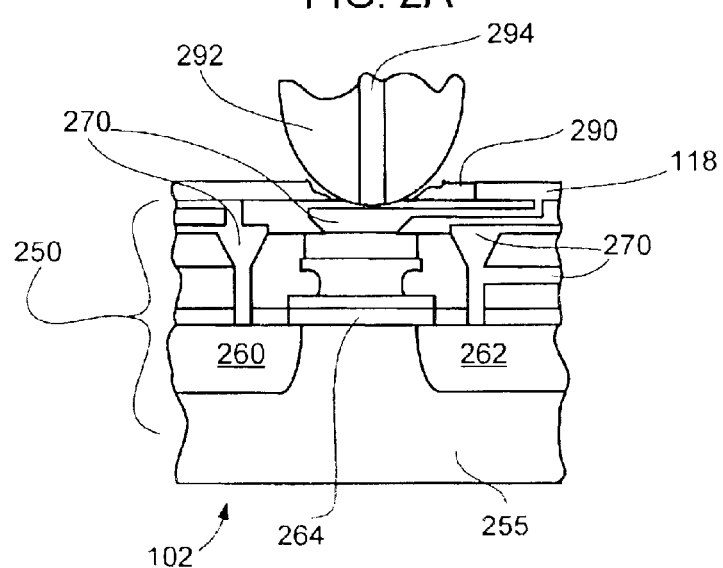
FIG. 2B is an enlarged partial cross-sectional view of a die including an array of electronic circuitry covered by a passivation layer.

Referring now to FIG. 2B therein is shown an enlarged partial cross-sectional view of the first die 102 including an array of electronic circuitry 250 built in and upon the surface of a semiconductive material 255 such as silicon. The array of electronic circuitry 250 includes layers of various electronic components such as a source 260, a drain 262, and a gate 264 of a transistor and an array of electrical interconnect 270 between the various electronic components. The manufacturing process of a die usually provides for a passivation layer 290 which is very thin to seal the array of electronic circuitry 250 and provide some degree of protection from environmental and physical damage during subsequent handling and manufacturing operations. The first die 102 also includes the first plurality of bonding pads 115, represented in FIG. 2B by the bonding pad 118, around the periphery of the first die 102 to provide for electrical connection of the array of electronic circuitry 250.

Adhesive application equipment is not particularly sensitive to the unpredicted variations that may occur during normal manufacturing in the thickness of dies or to the relative distance of the upper surface of the die from portions of the adhesive application equipment such as a nozzle 292. Portions of the adhesive application equipment may actually come into contact with, and consequently damage, some of the dies during application of an adhesive layer to the top of the die resulting in lower yields of semiconductor packages.

The nozzle 292 is shown coming into contact with the upper surface of the first die 102. As shown, when the nozzle 292 comes into contact with the passivation layer 290 on the first die 102 the array of electronic circuitry 250 can be damaged which may result in an electrical short or open circuit, or otherwise damage the integrity of the passivation layer 290 allowing for possible entry of moisture or other contaminants rendering the die inoperable. Consequently, the yield of good semiconductor packages is adversely affected by this problem. Changes in, or modifications to, the standard adhesive application equipment to accommodate these unpredicted variations would be time consuming to design and implement, and expensive.

The system of the present invention increases the yield of semiconductor packages having stacked dies without the time and expense associated with adhesive application equipment changes or modifications.

Figure 3:
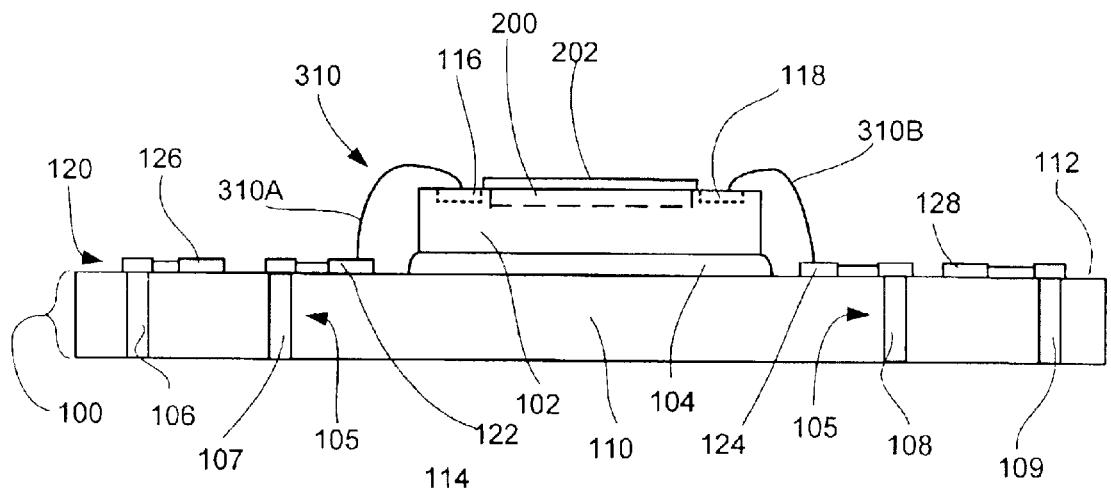
FIG. 3 is the structure of FIG. 2A with bonding wires bonded between the first die and the substrate.

Referring now to FIG. 3, therein is shown the structure of FIG. 2A, with the bonding pad 116 connected to the contact 122 using a wire 310A, and the contact 122 is connected to the via 107. Similarly, the bonding pad 118 is connected to the contact 124 using a wire 310B, and the contact 124 is connected to the via 108. The wire 310A and the wire 310B are to be understood as being representative of a first plurality of wires 310. Thus, the first plurality of wires 310 is connected between the first plurality of bonding pads 115 on the first die 102 and the plurality of contacts 120, or portion thereof, on the substrate 100. The first plurality of wires 310 typically used in packages of the type described herein are made of very fine wires of metals such as copper (Cu), aluminum (Al), or gold (Au). The first plurality of wires 310 are wire bonded using conventional techniques such as ultrasonic bonding, compression bonding, soldering, or other suitable techniques. The plurality of contacts 120 are in turn connected to the plurality of conductive vias 105.

Figure 4:
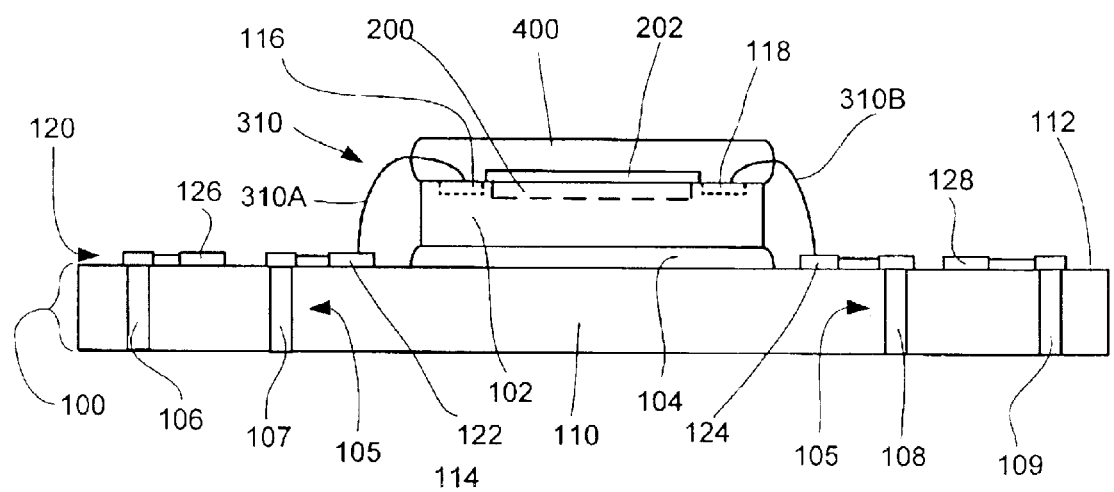
FIG. 4 is the structure of FIG. 3 with a second adhesive layer over the protective layer and the first die.

Referring now to FIG. 4, therein is shown the structure of FIG. 3 covered with an intermediate adhesive layer 400. The intermediate adhesive layer 400 is thick enough to cover both the protective layer 202 and the loops formed by the wires 310A and 310B at the bonding pads 116 and 118. Preferably, the intermediate adhesive layer 400 is an adhesive paste material that can be dispensed using adhesive application equipment described above.

Figure 5:
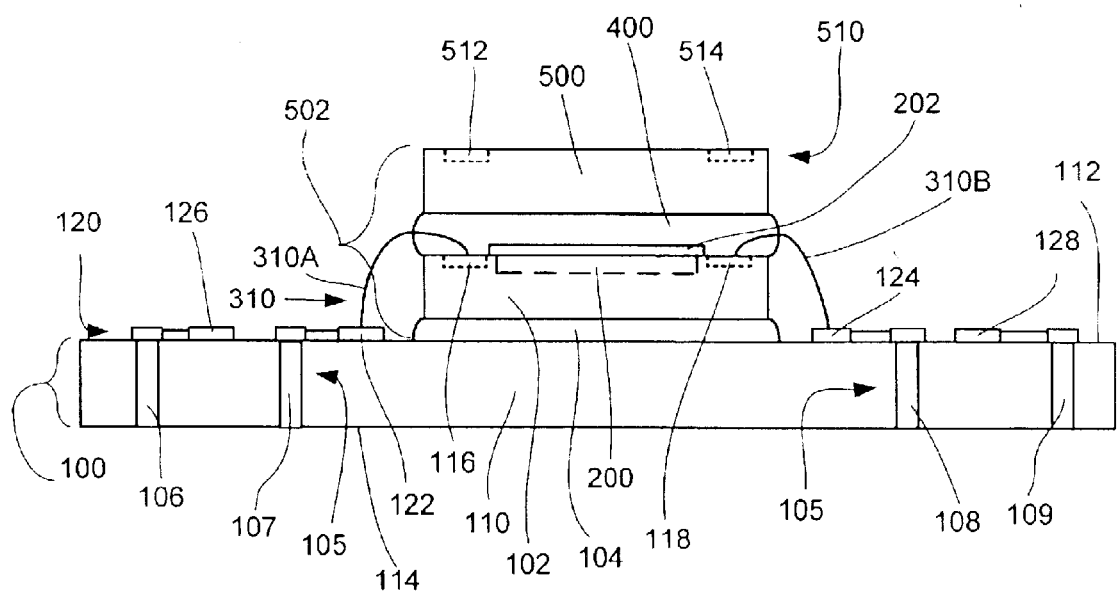
FIG. 5 is the structure of FIG. 4 with a second die attached forming a die stack in accordance with the present invention.

Referring now to FIG. 5, therein is shown the structure of FIG. 4 with a second die 500 attached to the intermediate adhesive layer 400 thus forming a die stack 502. The die stack 502 is comprised of the first adhesive layer 104, the first die 102, the protective layer 202, the intermediate adhesive layer 400, and the second die 500. The second die 500 has a second plurality of bonding pads 510, represented by a bonding pad 512 and a bonding pad 514. Preferably, the intermediate adhesive layer 400 extends slightly beyond the edges of the first die 102 to provide support for the second die 500 during subsequent wire bonding of the second plurality of bonding pads 510 on the second die 500 to the remaining portion of the plurality of contacts 120 on the substrate 100.

Figure 6:
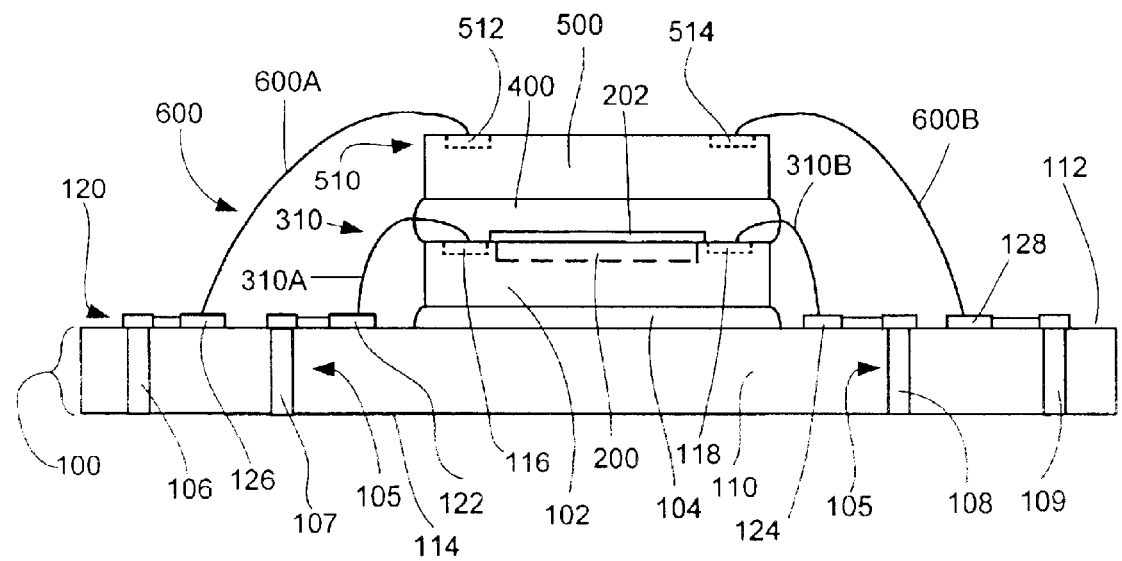
FIG. 6 is the structure of FIG. 5 with bonding wires bonded between the second die and the substrate.

Referring now to FIG. 6, therein is shown the structure of FIG. 5 after the second die 500 has been connected to the substrate 100. A second plurality of wires 600, represented by a wire 600A and a wire 600B, connects the second plurality of bonding pads 510 to the plurality of contacts 120. Accordingly, the bonding pad 512 is connected to the contact 126 on the substrate 100 using the wire 600A and the contact 126 is connected to the via 106. Similarly, the bonding pad 514 is connected to the contact 128 using the wire 600B, and the contact 128 is connected to the via 109. Therefore, the plurality of contacts 120 are in turn connected to the plurality of conductive vias 105. Both the first die 102 and the second die 500 are thus connected to the plurality of conductive vias 105 which pass through the substrate 100 from the upper surface 112 to the lower surface 114 of the substrate 100. The second die 500 can be smaller than, the same size as, or larger than the first die 102.

Figure 7:
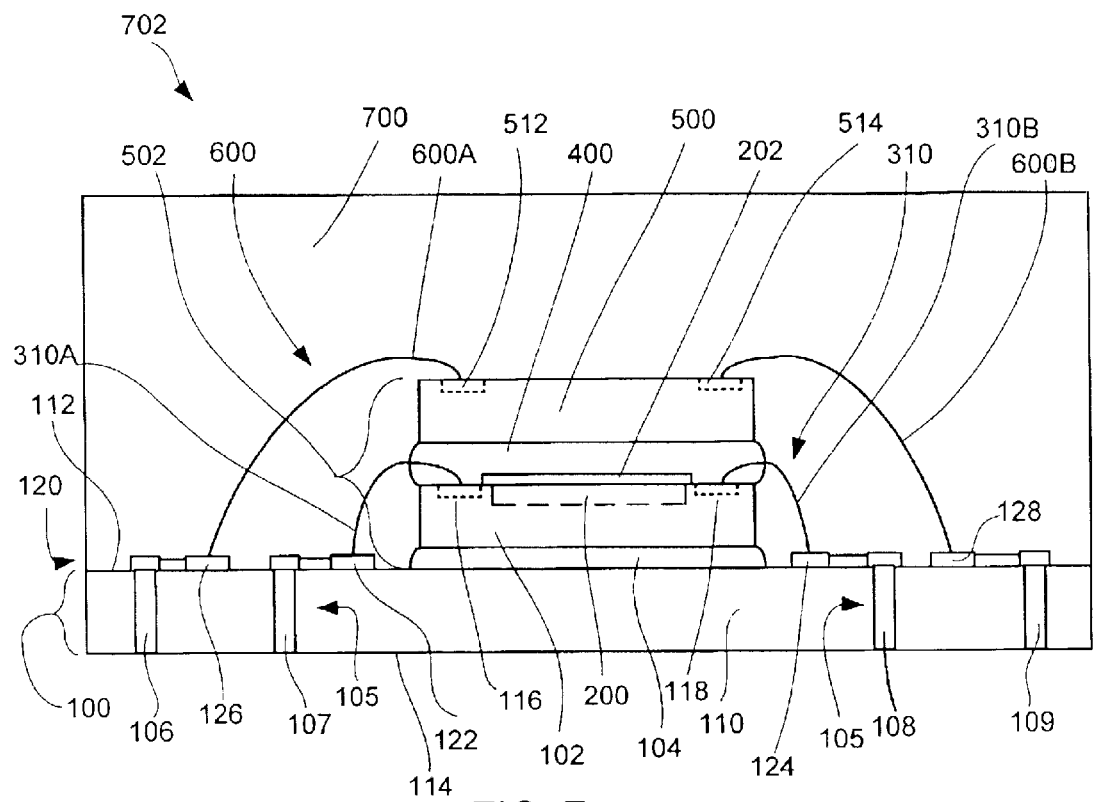
FIG. 7 is the structure of FIG. 6 after covering the die stack and bonding wires with an encapsulating material.

Referring now to FIG. 7, therein is shown the structure of FIG. 6 after the die stack 502, the first plurality of wires 310, and the second plurality of wires 600 are covered with an encapsulating material 700. The encapsulating material 700 of a semiconductor package 702 is created using conventional methods of mold formation and epoxy or plastic injection into the mold. Organic polymeric encapsulants can be used such as thermoplastics, thermoset plastics, and elastomers. It also will be apparent that hermetic seals combined with heat sinks for protection of the die stack 502 from environmental and thermal damage can be used in a conventional manner.

Figure 8:
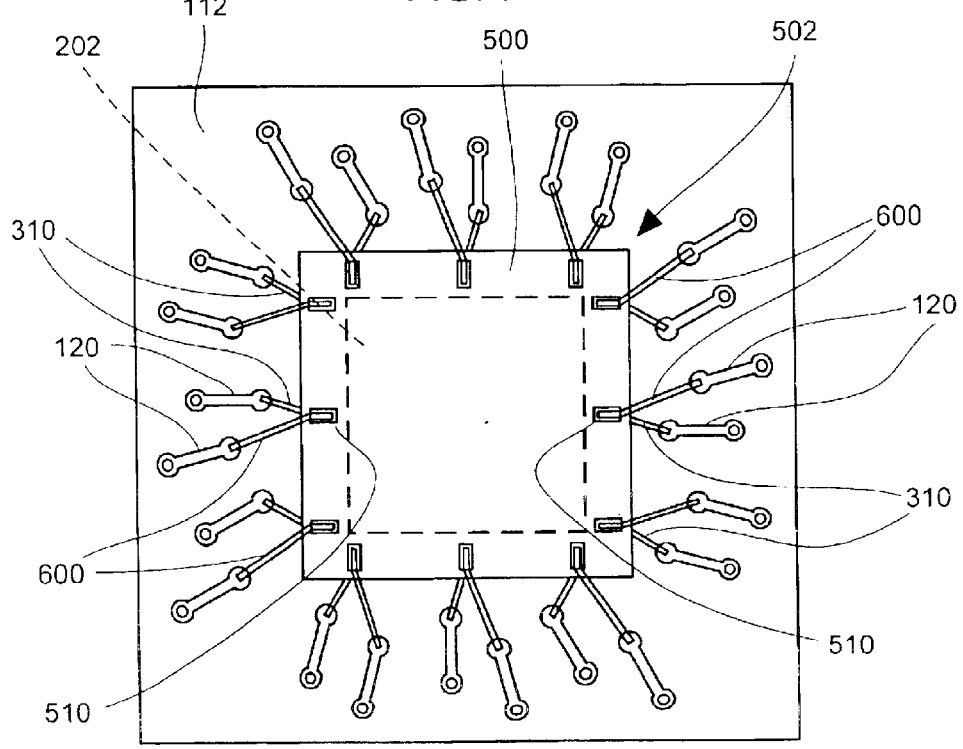
FIG. 8 is a plan view of the substrate prior to encapsulation of the die stack and bonding wires.

Referring now to FIG. 8, therein is shown a plan view of the package described herein prior to encapsulation of the die stack 502. The upper surface 112 supports the die stack 502. Although the upper surface of the second die 500 of the die stack 502 is shown in FIG. 8, one skilled in the art will appreciate that the other elements of the die stack 502 as previously discussed are beneath the second die 500. The protective layer 202 is in the central portion of the die stack 502 as discussed above (see FIGS. 2A through 7).

The upper surface 112 of the substrate 100 is patterned to create the plurality of contacts 120 using conventional photosensitive and etching techniques known in the semiconductor industry. The plurality of contacts 120 are connected to the first die 102 and the second die 500 in the die stack 502 by the first plurality of wires 310 and the second plurality of wires 600 respectively.

Figure 9:
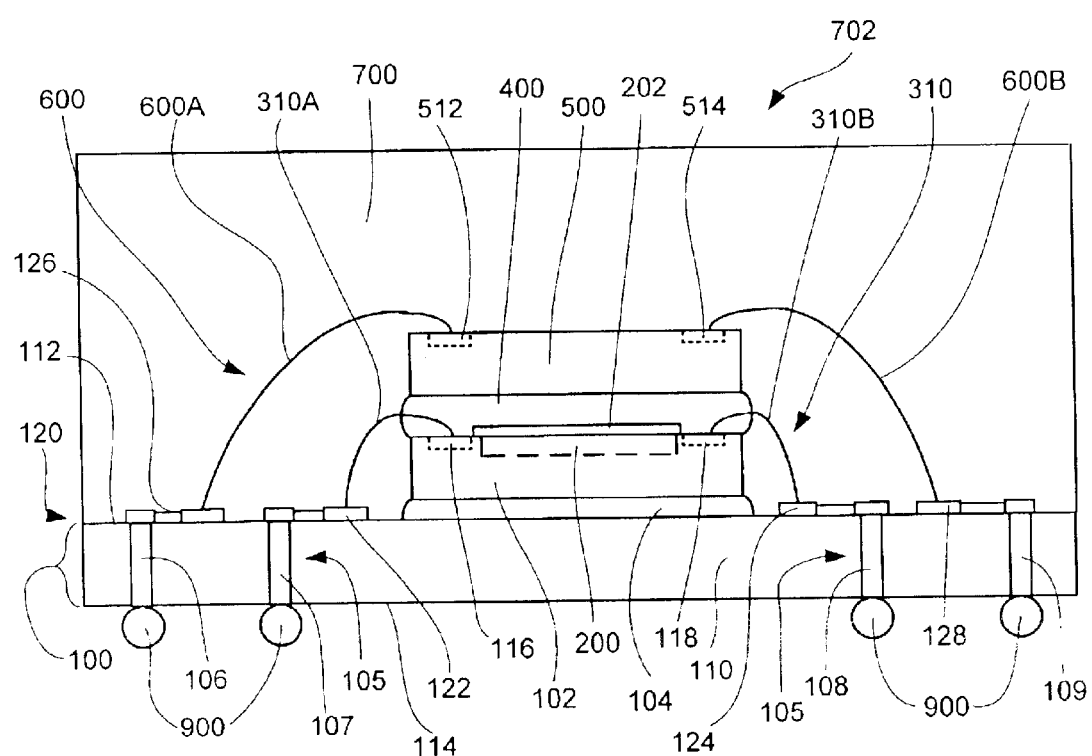
FIG. 9 is the structure of FIG. 7 with solder balls attached.

Referring now to FIG. 9, therein is shown the structure of FIG. 7 having a plurality of solder balls 900 attached to the plurality of conductive vias 105 extending to the lower surface 114 of the substrate 100 in a conventional manner to provide for connection of the semiconductor package 702 to a printed circuit board (not shown). There is thus provided an electrical connection from the plurality of solder balls 900 to the plurality of conductive vias 105. The plurality of conductive vias 105 is electrically connected to the plurality of contacts 120. A portion of the plurality of contacts 120 are connected to the first plurality of bonding pads 115 on the first die 102 using the first plurality of wires 310, and another portion of the plurality of contacts 120 are connected to the second plurality of bonding pads 510 on the second die 500 using the second plurality of wires 600. Accordingly, the first plurality of bonding pads 115 on the first die 102 and the second plurality of bonding pads 510 on the second die 500 are thus electrically connected to the plurality of solder balls 900.

Figure 10:
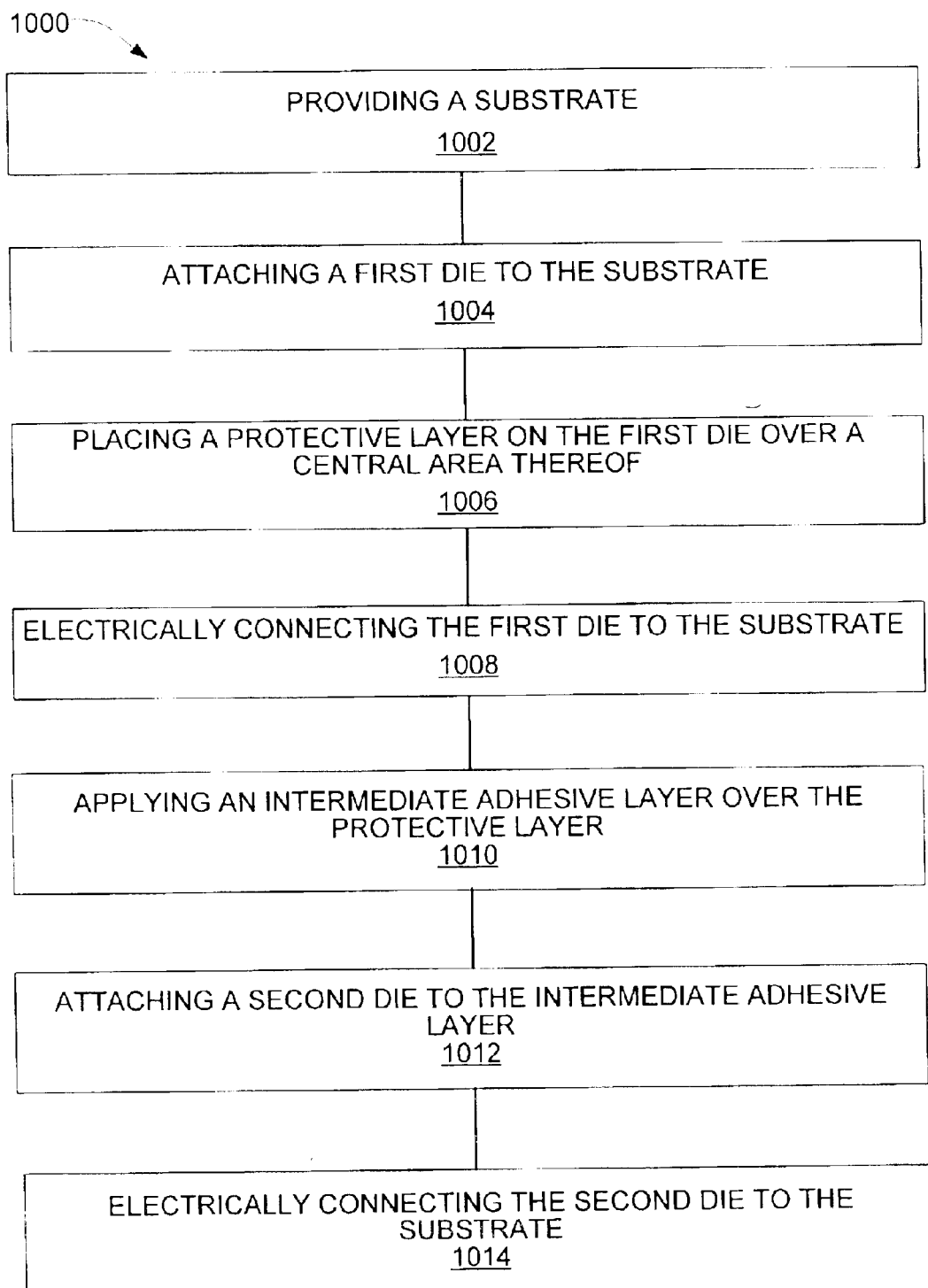
FIG. 10 is a flow chart of the method of the present invention.

Referring now to FIG. 10, therein is shown the steps of a method 1000 of the present invention. The method 1000 of assembling a semiconductor package with multiple dies in accordance with the present invention comprises: a step 1002 of providing a substrate; a step 1004 of attaching a first die to the substrate; a step 1006 of placing a protective layer on the first die over a central area thereof; a step 1008 of electrically connecting the first die to the substrate; a step 1010 of applying an intermediate adhesive layer over the protective layer; a step 1012 of attaching a second die to the intermediate adhesive layer; and a step 1014 of electrically connecting the second die to the substrate.

While the invention has been described in conjunction with the specific embodiments shown, it is to be understood that many alternatives, modifications, and variations will be apparent to those skilled in the art in light of the foregoing description. Accordingly, it is intended to embrace all such alternatives, modifications, and variations that fall within the spirit and scope of the included claims. All matters hitherto-fore set forth herein or shown in the accompanying drawings are to be interpreted in an illustrative and non-limiting sense.

The invention claimed is:

1. A method of assembling a semiconductor package with stacked dies comprising:
providing a substrate;
attaching a first die to the substrate;
placing a protective layer on the first die over a central area thereof;
electrically connecting the first die to the substrate;
applying an intermediate adhesive layer over the protective layer;
attaching a second die to the intermediate adhesive layer; and
electrically connecting the second die to the substrate.

2. The method as claimed in claim 1 wherein applying an intermediate adhesive layer comprises dispensing through a nozzle a curable adhesive; and curing the adhesive.

3. The method as claimed in claim 1 wherein placing the protective layer places an organic material having a thermal coefficient of expansion in the range of about 7 to about 70 ppm/° C. at temperatures below about 40° C., and about 20 to about 200 ppm/° C. at temperatures above about 40° C.

4. The method as claimed in claim 1 wherein placing the protective layer on the first die places a material selected from the group of materials consisting of a polyimide, a screen-printable polymer, an elastomeric film, and combinations thereof.

5. The method as claimed in claim 1 wherein placing the protective layer comprises a method selected from a group consisting of cut-pick-and-placing of a film, screen printing of a screen printable polymer, film transferring of a film, wafer laminating, and combinations thereof.

6. A method of assembling a semiconductor package with stacked dies comprising:
providing a substrate;
applying a first adhesive layer on the substrate;
attaching a first die, having a first plurality of bonding pads at the outer periphery thereof defining a central area of the die, to the first adhesive layer;
applying a protective layer on the central area of the first die;
electrically connecting the first plurality of bonding pads to the substrate;
applying an intermediate adhesive layer on the first die covering the protective layer and the first plurality of bonding pads;
attaching a second die, having a second plurality of bonding pads thereon, to the intermediate adhesive layer; and
electrically connecting the second plurality of bonding pads to the substrate.

7. The method as claimed in claim 6 wherein applying an intermediate adhesive layer comprises dispensing through a nozzle a curable adhesive; and curing the adhesive.

8. The method as claimed in claim 6 wherein applying a protective layer applies an organic material having a thermal coefficient of expansion in the range of about 7 to about 70 ppm/° C. at temperatures below about 40° C., and about 20 to about 200 ppm/° C. at temperatures above about 40° C.

9. The method as claimed in claim 6 wherein applying a protective layer applies a material selected from the group consisting of a polyimide, a screen-printable polymer, an elastomeric film, and combinations thereof.

10. The method as claimed in claim 6 wherein applying a protective layer is selected from a group consisting of cut-pick-and-placing of a film, screen printing of a screen printable polymer, film transferring of a film, wafer laminating, and combinations thereof.

11. A semiconductor package with stacked dies comprising:
a substrate;
a first die attached to the substrate;
a first plurality of wires electrically connecting the first die to the substrate;
a protective layer on the first die over a central area thereof;
an intermediate adhesive layer applied over the protective layer;
a second die attached to the intermediate adhesive layer; and
a second plurality of wires electrically connecting the second die to the substrate.

12. The semiconductor package as claimed in claim 11 wherein the protective layer comprises an organic material.

13. The semiconductor package as claimed in claim 11 wherein the protective layer is an organic material having a thermal coefficient of expansion in the range of about 7 to about 70 ppm/° C. at temperatures below about 40° C., and about 20 to about 200 ppm/° C. at temperatures above about 40° C.

14. The semiconductor package as claimed in claim 11 wherein the protective layer is a material selected from the group of materials consisting of a polyimide, a screen-printable polymer, an elastomeric film, and combinations thereof.

15. The semiconductor package as claimed in claim 11 wherein the protective layer is applied using a method selected from the group consisting of cut-pick-and-placing of a film, screen printing of a screen printable polymer, film transferring of a film, wafer laminating, and combinations thereof.

16. A semiconductor package with stacked dies comprising:
- a substrate;
- a first adhesive layer on the substrate;
- a first die, having a first plurality of bonding pads at the outer periphery thereof defining a central area of the die, attached to the first adhesive layer;
- a protective layer covering the central area of the first die;
- a first plurality of wires connecting the first plurality of bonding pads to the substrate;
- an intermediate adhesive layer applied over the protective layer and the first plurality of bonding pads;
- a second die, having a second plurality of bonding pads thereon, attached to said intermediate adhesive layer; and
- a second plurality of wires connecting the second plurality of bonding pads to the substrate.

17. The semiconductor package as claimed in claim 16 wherein said protective layer comprises an organic material.

18. The semiconductor package as claimed in claim 16 wherein said protective layer is an organic material having a thermal coefficient of expansion in the range of about 7 to about 70 ppm/° C. at temperatures below about 40° C., and about 20 to about 200 ppm/° C. at temperatures above about 40° C.

19. The semiconductor package as claimed in claim 16 wherein said protective layer is selected from the group of materials consisting of a polyimide, a screen-printable polymer, an elastomeric film, and combinations thereof.

20. The semiconductor package as claimed in claim 16 wherein the protective layer is applied using a method selected from the group consisting of cut-pick-and-placing of a film, screen printing of a screen printable polymer, film transferring of a film, wafer laminating, and combinations thereof.

* * * * *

UNITED STATES PATENT AND TRADEMARK OFFICE
CERTIFICATE OF CORRECTION

PATENT NO.   : 6,833,287 B1
DATED        : December 21, 2004
INVENTOR(S)  : Hur et al.

It is certified that error appears in the above-identified patent and that said Letters Patent is hereby corrected as shown below:

Column 6,
Line 56, delete "photosensitive" and insert therefor -- photoresistive --

Signed and Sealed this

Nineteenth Day of April, 2005

JON W. DUDAS
*Director of the United States Patent and Trademark Office*